(12) United States Patent
Zhao et al.

(10) Patent No.: US 12,406,178 B2
(45) Date of Patent: Sep. 2, 2025

(54) APPARATUS AND METHOD FOR HEAT SOURCE LOCALIZATION AND PEAK TEMPERATURE ESTIMATION

(71) Applicant: Western New England University, Springfield, MA (US)

(72) Inventors: Jingzhou Zhao, East Longmeadow, MA (US); Feng Ye, Beavercreek, OH (US)

(73) Assignee: WESTERN NEW ENGLAND UNIVERSITY, Springfield, MA (US)

( * ) Notice: Subject to any disclaimer, the term of this patent is extended or adjusted under 35 U.S.C. 154(b) by 958 days.

(21) Appl. No.: 16/533,092

(22) Filed: Aug. 6, 2019

(65) Prior Publication Data

US 2020/0042870 A1 Feb. 6, 2020

Related U.S. Application Data

(60) Provisional application No. 62/714,991, filed on Aug. 6, 2018.

(51) Int. Cl.
| | |
|---|---|
| *G06N 20/10* | (2019.01) |
| *G06F 17/11* | (2006.01) |
| *G06N 3/065* | (2023.01) |
| *G06N 3/08* | (2023.01) |
| *G11C 5/02* | (2006.01) |
| *H10N 10/01* | (2023.01) |
| *H10N 10/17* | (2023.01) |

(52) U.S. Cl.
CPC .............. *G06N 3/065* (2023.01); *G06F 17/11* (2013.01); *G06N 3/08* (2013.01); *H10N 10/01* (2023.02); *H10N 10/17* (2023.02)

(58) Field of Classification Search
CPC ........ G06N 3/0635; G06N 3/08; G06F 17/11; H01L 35/32; H01L 35/34
See application file for complete search history.

(56) References Cited

U.S. PATENT DOCUMENTS

| | | | | |
|---|---|---|---|---|
| 8,750,065 | B2 * | 6/2014 | Merkel | G11C 13/0069 365/189.14 |
| 8,838,395 | B2 * | 9/2014 | Matsiev | G01N 27/026 702/22 |
| 2003/0135971 | A1 * | 7/2003 | Liberman | B22F 1/0547 29/419.1 |
| 2006/0033697 | A1 * | 2/2006 | Yang | G09G 3/3648 345/101 |
| 2007/0285843 | A1 * | 12/2007 | Tran | G11C 13/025 360/245.9 |

(Continued)

*Primary Examiner* — Brandon S Cole
(74) *Attorney, Agent, or Firm* — CANTOR COLBURN LLP

(57) ABSTRACT

A heat source sensor includes a plurality of first wires extending in a first direction, a plurality of second wires extending in a second direction different from the first direction and crossing the plurality of first wires, and a plurality of nodes. Each node is defined at a crossing of a first wire of the plurality of first wires and a second wire of the plurality of second wires. The first wire is secured to the second wire at the node. Each node of the plurality of nodes defines a measurement point of the heat source sensor, with a difference in thermoelectric electromotive forces between two nodes of the plurality of nodes indicative of a temperature difference between the two nodes.

5 Claims, 10 Drawing Sheets

(56) References Cited

U.S. PATENT DOCUMENTS

| | | | | |
|---|---|---|---|---|
| 2011/0043742 A1* | 2/2011 | Cavanaugh | ............ | G02F 1/1339 |
| | | | | 349/153 |
| 2012/0098815 A1* | 4/2012 | Hou | ................. | G09G 3/3677 |
| | | | | 345/212 |
| 2015/0037517 A1* | 2/2015 | Buriak | ................. | B05D 1/02 |
| | | | | 427/108 |
| 2017/0370782 A1* | 12/2017 | Pecquet | ................ | G01K 7/08 |
| 2018/0045580 A1* | 2/2018 | Merrikh | ............... | G01K 7/021 |
| 2018/0217117 A1* | 8/2018 | Tran | .................... | G11C 13/04 |
| 2019/0147329 A1* | 5/2019 | Hekmatshoartabari | .................... | |
| | | | | G06N 3/0635 |
| | | | | 706/26 |

\* cited by examiner (b)

APPARATUS AND METHOD FOR HEAT SOURCE LOCALIZATION AND PEAK TEMPERATURE ESTIMATION

CROSS-REFERENCE TO RELATED APPLICATIONS

This application claims the benefit of U.S. Provisional Application No. 62/714,991, filed Aug. 6, 2018, which is incorporated herein by reference in its entirety.

BACKGROUND

Exemplary embodiments pertain to the art of heat source location identification and strength estimation.

Central to a wide range of challenging engineering problems is the need for fast and accurate identification of the location and strength of a small heat source, whether the heat source is induced or spontaneous, over a large area. Induced heat sources are ubiquitous in manufacturing processes of thermo-mechanical origin, such as laser processing, machining, and welding, where location and strength of heat sources are important process parameters that need to be monitored in real-time for quality assurance, diagnose and prognosis. Vibration induced heat generation is used to locate cracks in materials for non-destructive testing where locations of heat sources need to be identified as accurately as possible.

On the other hand, spontaneous heat sources are often signs of the onset of critical changes in a system that require immediate attention, such as thermal runaway in lithium ion batteries (LIBs), short circuits in integrated circuits (ICs) or solar cells, localized rise of body temperatures due to tumors, or abrupt temperature change of the surface of a hypersonic vehicle due to boundary layer transition from laminar to turbulent, etc.

Direct experimental localization and strength estimation of heat sources requires measurement systems with not only high spatial and temporal resolution but also high Spatial Dynamic Range (SDR), which is so far achievable only by infrared (IR) thermal imaging techniques made possible by a wave sensing device such as a Focal Plane Array (FPA) thanks to the advancements in microsystem technologies and the non-intrusive nature of radiation heat transfer. High SDR thermal imaging techniques based on conductive heat transfer, however, is still in its infancy in spite of the pressing needs in situations where even IR cameras fall short (e.g. limited space, harsh environment, internal heat source, etc.), which motivates the studies of Inverse Heat Conduction Problems (IHCP) that seek to numerically locate heat sources from limited sensor inputs. State-of-the-art conductive thermal imaging techniques employ arrays of thermocouples or resistance temperature detectors (RTDs), which suffer from either high manufacturing cost or low temporal resolution.

BRIEF DESCRIPTION

In one embodiment, a heat source sensor includes a plurality of first wires extending in a first direction, a plurality of second wires extending in a second direction different from the first direction and crossing the plurality of first wires, and a plurality of nodes. Each node is defined at a crossing of a first wire of the plurality of first wires and a second wire of the plurality of second wires. The first wire is secured to the second wire at the node. Each node of the plurality of nodes defines a measurement point of the heat source sensor, with a difference in thermoelectric electromotive forces between two nodes of the plurality of nodes indicative of a temperature difference between the two nodes.

Additionally or alternatively, in this or other embodiments the plurality of first wires is perpendicular or at an angle to the plurality of second wires.

Additionally or alternatively, in this or other embodiments the plurality of first wires are formed from a first material and the plurality of second wires are formed from a second material different from the first material.

Additionally or alternatively, in this or other embodiments the plurality of first wires are Chromel®, and the plurality of second wires are Alumel®.

Additionally or alternatively, in this or other embodiments the first wire is welded to the second wire at each node.

Additionally or alternatively, in this or other embodiments the plurality of first wires and the plurality of second wires are arranged in a woven configuration.

In another embodiment, a heat source localization and peak temperature estimation system includes a heat source sensor including a plurality of first wires extending in a first direction, a plurality of second wires extending in a second direction different from the first direction and crossing the plurality of first wires, and a plurality of nodes. Each node is defined at a crossing of a first wire of the plurality of first wires and a second wire of the plurality of second wires. The first wire is secured to the second wire at the node. Each node of the plurality of nodes defines a measurement point of the heat source sensor, with a difference in thermoelectric electromotive forces between two nodes of the plurality of nodes indicative of a temperature difference between the two nodes. A data acquisition system is configured to receive the plurality of thermoelectric electromotive forces from the plurality of nodes, compare the plurality of thermoelectric electromotive forces to a mathematical model, and determine a heat source location and peak temperature based on a result of the comparison.

Additionally or alternatively, in this or other embodiments the plurality of first wires is perpendicular to the plurality of second wires.

Additionally or alternatively, in this or other embodiments the plurality of first wires are formed from a first material and the plurality of second wires are formed from a second material different from the first material.

Additionally or alternatively, in this or other embodiments the plurality of first wires are Chromel®, and the plurality of second wires are Alumel®.

Additionally or alternatively, in this or other embodiments the first wire is welded to the second wire at each node.

Additionally or alternatively, in this or other embodiments the plurality of first wires and the plurality of second wires are arranged in a woven configuration.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

The present disclosure relates to a new thermal conduction based heat source sensing mechanism realized by thermocouple wires assembled in a mesh configuration (Thermomesh), whose characteristics are described by a linear model of a finite grid of voltage sources with internal resistances. The source localization and strength estimation problem is then translated to a mathematical one which is to solve an ill-posed underdetermined linear system. Thermomesh is different from all existing sensors (including contact and non-contact) for heat source localization and strength estimation purposes in that the inverse of all existing sensor models are always well-posed with unique and stably solvable solutions but the inverse of the sensor model of Thermomesh is ill-posed with no unique and stable solution without prior information of the heat source. While numerous solution techniques are available to solve IHCP with measurements from traditional sensors, the possibility of solving IHCP using the Thermomesh sensor is unknown. Here, we demonstrate the potential of Machine Learning (ML) algorithms toward this goal. Source localization and strength estimation are respectively achieved with high confidence by Deep Learning (DL) based classification and Artificial Neural Network (ANN) based prediction algorithms without the need to compute the solution, i.e. the temperature distribution.

Figure 1:
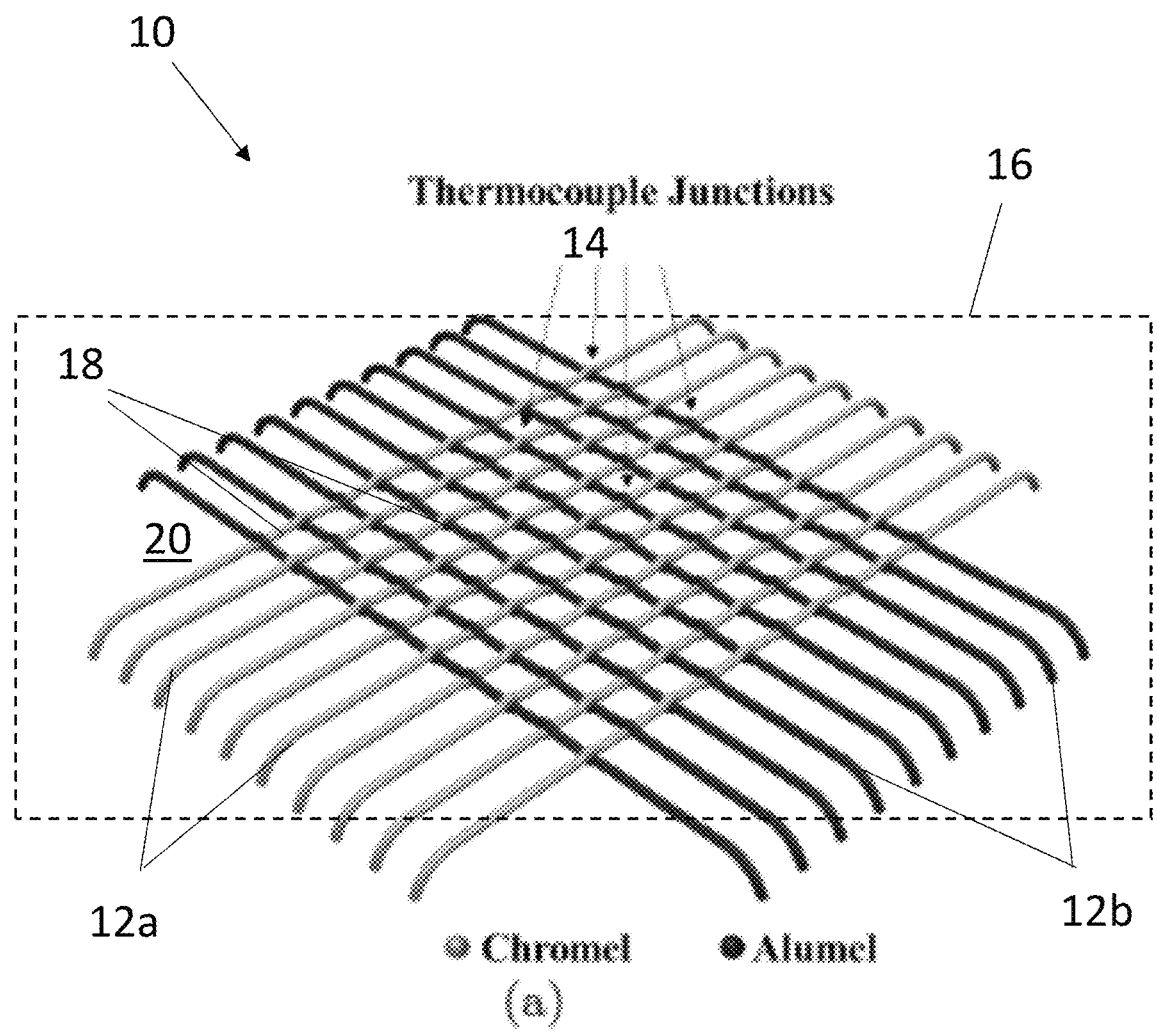
FIG. 1 is a perspective view of an embodiment of a heat source sensor.

Referring now to FIG. 1, a thermomesh sensor 10 includes a plurality of thermocouple wires 12 assembled (or welded, printed, deposited, etc.) in a wire mesh configuration. The plurality of thermocouple wires 12 includes a plurality of first wires 12a extending in a first direction, and a plurality of second wires 12b extending in a second direction. A node 14 is defined where a first wire 12a crosses a second wire 12b, with the plurality of first wires 12a and the plurality of second wires 12b defining a plurality of nodes 14.

In some embodiments, the plurality of first wires 12a are parallel-extending, and the plurality of second wires 12b are parallel-extending. Further, in some embodiments, each first wire 12a of the plurality of first wires 12a is perpendicular or at an angle to each second wire 12b of the plurality of second wires 12b. One skilled in the art will readily appreciate that this configuration is merely exemplary, and other configurations of thermocouple wires 12 to define the plurality of nodes 14 are contemplated within the scope of the present disclosure. In the embodiment illustrated in FIG. 1, the first wires 12a and the second wires 12b are arranged in a woven arrangement and secured at each node 14. In some embodiments, the plurality of first wires 12a are Chromel®, while the plurality of second wires 12b are Alumel®. In some embodiments, the plurality of thermocouple wires 12 are arrayed on or in a substrate 20. Further, in some embodiments the nodes 14 are arranged approximately 10 µm apart, but in other embodiments other node spacing may be utilized.

Figure 2:
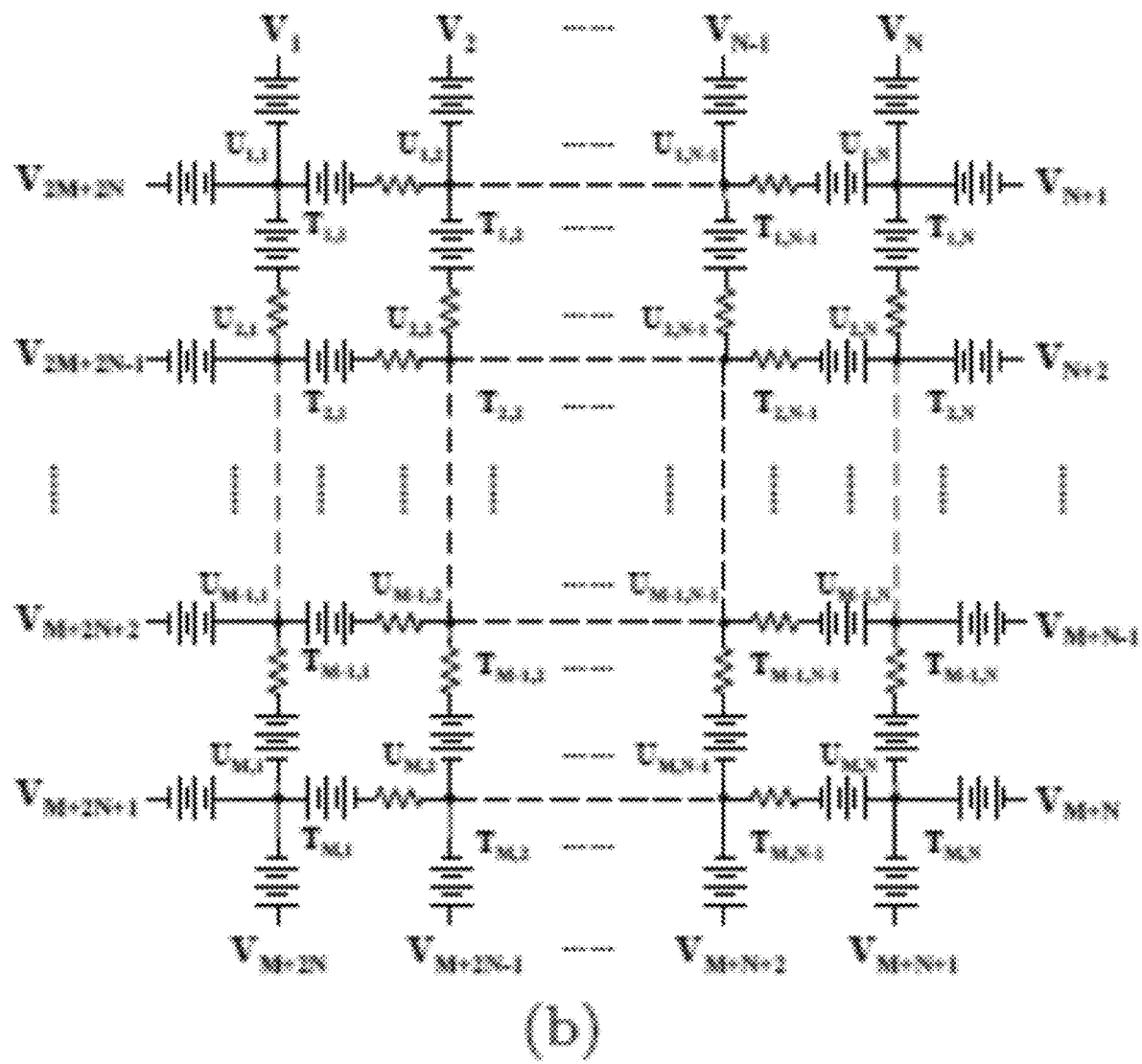
FIG. 2 is a schematic illustration of an equivalent circuit defined by an embodiment of a heat source sensor.

Each node 14 or junction is electrically connected, as shown in FIG. 1 and represents a heat source sensing point, which is in thermal equilibrium with the measurand (schematically illustrated at 16) in contact with the thermomesh sensor 10, or object to be measured. Temperature differences between adjacent nodes 14 generate thermoelectric electromotive forces (EMF) in the thermocouple wires due to the Seebeck effect. Wire segments 18 connecting adjacent nodes 14 are therefore be considered as voltage sources with an internal resistance, whose EMF is determined by the temperature difference and a Seebeck coefficient of the wire segments 18 between adjacent nodes 14, leading to an equivalent circuit of a M×N Thermomesh sensor shown in FIG. 2.

Applying Kirchhoff current law, the net current entering each node 14 is equal to zero and a system of linear equations is obtained and shown as Equation 1 below:

$$C_{i,j;i+1,j}(U_{i,j}-U_{i+1,j}+s_n T_{i,j}-s_n T_{i+1,j}) \quad (1)$$

$$+C_{i,j;i-1,j}(U_{i,j}-U_{i-1,j}+s_n T_{i,j}-s_n T_{i-1,j})$$

$$+C_{i,j;i,j+1}(U_{i,j}-U_{i,j+1}+s_p T_{i,j}-s_p T_{i,j+1})$$

$$+C_{i,j;i,j-1}(U_{i,j}-U_{i,j+1}+s_p T_{i,j}-s_p T_{i,j+1})=0;$$

where $C_{i,j;k,1}$ is the wire conductance between node (i; j) and node (k; 1), $s_n$ the negative Seebeck coefficient of the first wires 12a, $s_p$ the positive Seebeck coefficient of the second wires 12b, $U_{i,j}$ the electric potential of node (i; j), and $T_{i,j}$ the difference between temperature of node (i; j) and the cold-junction where the exterior boundary potentials $V=[V1, V2, \ldots, V_{2M+2N}]$ are measured. An additional precision analog silicon temperature sensor 20, such as (LM34CAZ from Texas Instruments) measures the cold junction temperature.

After rewriting Equation 1 in matrix form, Equation 2, below, is obtained.

$$CU = C\begin{bmatrix} U_{1,1} \\ U_{1,2} \\ \vdots \\ U_{2,1} \\ \vdots \\ U_{M,N} \end{bmatrix} = S\begin{bmatrix} T_{1,1} \\ T_{1,2} \\ \vdots \\ T_{2,1} \\ \vdots \\ T_{M,N} \end{bmatrix} = ST \quad (2)$$

where $U=[U_{1,1} \ldots U_{M,N}]^T$ is the vectorized potential matrix for internal nodes, C the conductance matrix, S the Seebeck coefficient matrix, and T the vectorized temperature matrix. The exterior boundary potentials $V=[V1; V2, \ldots, V_{2M+2N}]$ to be measured, are related to vector T by $$V=AT; \quad (3)$$

where A is a 2M+2M by MN matrix.

The complete reconstruction of T from measured V is therefore an ill posed underdetermined inverse problem. However, we show strong evidence of accurate heat source localization and peak temperature estimation via numerical experiments.

Figure 3:
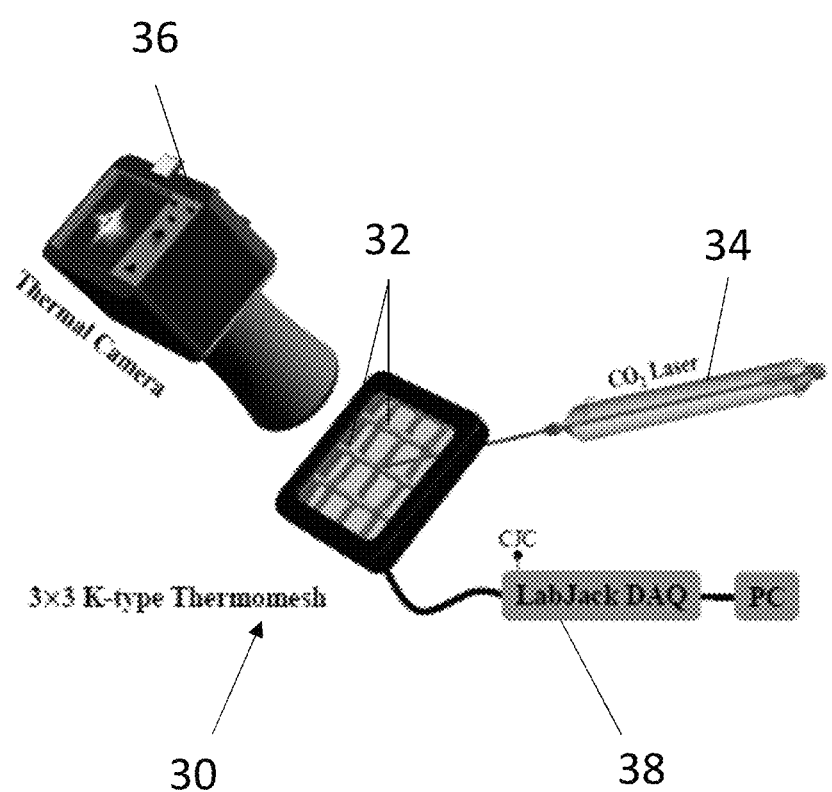
FIG. 3 is a schematic illustration of a test apparatus for a heat source sensor.

Referring now to FIG. 3, an experiment was designed to verify the physical model on a 3×3 Thermomesh 30 using bare K-type thermocouple wires resistively welded together at each of the 9 junctions 32 and covered from both sides by polyimide tapes as shown in FIG. 3. For each measurement, a $CO_2$ laser beam 34 approximately 3 mm wide is focused on one of the junctions 32 for an extended period of time allowing the temperatures to be recorded on the thermal camera 36 to reach steady state. A total of 27 thermal images were taken with laser focused sequentially on each of the 9 junctions 32 at three different power levels 36 W, 40 W, and 44 W, while the 12 exterior boundary potentials being streamed at 0.5 s per cycle for approximately 10 s by a multichannel data acquisition system 38. The 9 junction temperatures on each thermal image are then extracted and plugged into the model to calculate the exterior boundary potential vector V and compared with the experimentally measured ones.

The average error between calculated and experimental potentials is 54 µV, corresponding to less than 2 degrees Celsius for K-type thermocouples which has a sensitivity of approximately 41.6 µV per degree Celsius (32.8 µV per degree Celsius for Chromel and −8.8 µV per degree Celsius for Alumel at 900 degrees Celsius) suggesting agreement between the model and sensor response to the given temperature inputs.

Successful validation of the physical model allowed for performance of numerical experiments that reliably predict the experimental outcome at much higher data generation rate and reduced costs. By letting the Thermomesh sensors 10 have negligible thermal mass compared to the measurand, which can be realized by using thinner thermocouple wires, the changes in the exterior boundary potentials follow the change of temperature inputs almost instantaneously, permitting in-situ temperature measurement of which the temporal resolution is only limited by the sampling rate of the data acquisition device 36 and the computational time. For the purpose of demonstrating the capability of the Thermomesh sensors 10 for high spatial resolution heat source localization and peak temperature estimation, a two-dimensional Gaussian function was utilized with randomly generated locations, standard deviations, and peak values as temperature inputs to 1) calculate the exterior boundary potentials and 2) train the Machine Learning (ML) models. A deep learning (DL) based classification is used for heat source localization and an artificial neural network (ANN) based prediction is used for peak temperature estimation.

Figure 4:
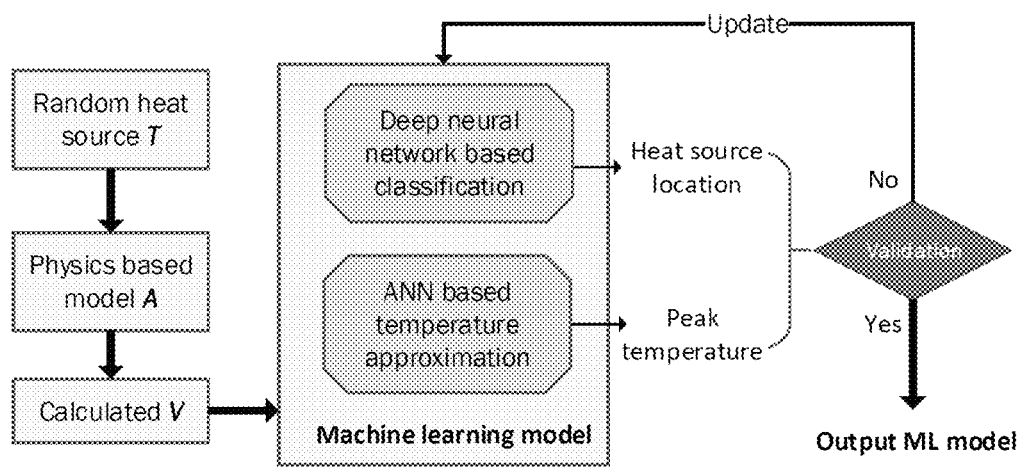
FIG. 4 is a schematic illustration of a method of machine learning model training and validation.

A flowchart depicting the procedures for ML model training and validation is shown in FIG. 4. The experiment is considered a success if the trained ML model is able to accurately identify the location and the peak value of the temperature inputs with high confidence, when given the calculated potentials as inputs. A K-type 10×10 Thermomesh sensor 10 is used in the numerical experiments.

Figure 5:
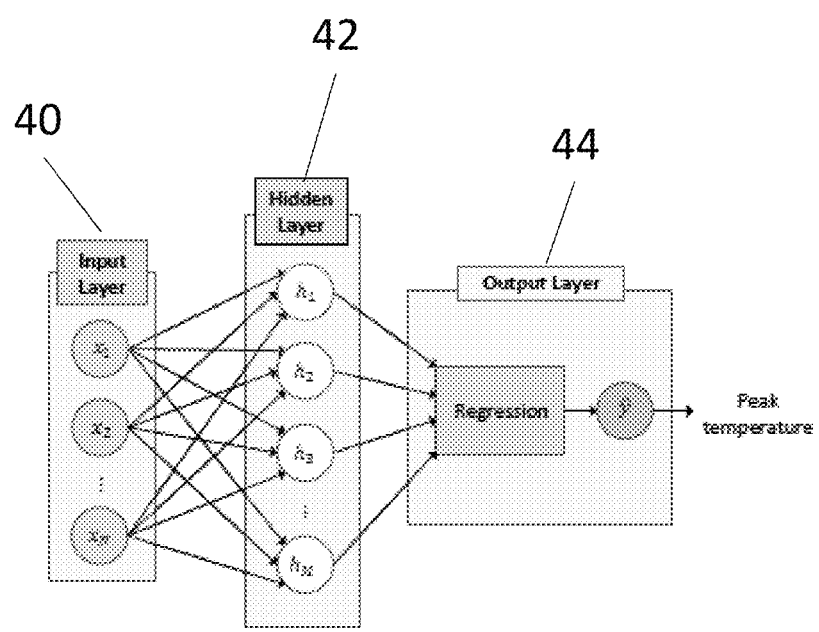
FIG. 5 is a schematic illustration of an ANN model.

The peak temperature of a measurement is predicted with an artificial neural network (ANN) based model, as shown in FIG. 5. The applied ANN structure includes an input layer 40, one hidden layer 42, and an output layer 44. The N input data $x=\{x_1; x_2, \ldots, x_N\}$ is fed to the input layer 40. The hidden layer 42 includes multiple (e.g. M) neurons. Each neuron, e.g. $h_j$, is a function represented as equation 3, below $$h_j = \sigma(\Sigma_{i=1}^{N}(W^{(1)}_i * x_i + b^{(1)}_i)) \quad (3)$$

where σ(*) is an activation function as follows:

$$\sigma(t) = 1/(1+e^{-t}) \quad (4)$$

The activation function provides a smooth transition as input values change. $W^{(1)} = [w_1^{(1)}, w_2^{(1)}, \ldots w_N^{(1)}]$ is a weight matrix and $b^{(1)} = [b_1^{(1)}, b_2^{(1)}, \ldots b_N^{(1)}]$ is a bias vector. The output is computed from a regression layer as shown in Equation 5:

$$\hat{y} = \sum_{i=1}^{M}(w_i^{(2)} h_i + b_i^{(2)}) \quad (5)$$

where $W^{(2)} = [w_1^{(2)}, w_2^{(2)}, \ldots w_N^{(2)}]$ is a weight matrix and $b^{(2)} = [b_1^{(2)}, b_2^{(2)}, \ldots b_N^{(2)}]$ is a bias vector. The ANN structure includes one input layer 40, one hidden layer 42 and one output layer 44. The hidden layer includes 200 neurons. Minimum square error (MSE) is applied as a loss function, defined as in Equation 6:

$$\begin{aligned}
L &= \frac{1}{2}\sum_{k=1}^{K}(y^k - \hat{y}^k)^2 \\
&= \frac{1}{2}\sum_{k=1}^{K}(y^k - (w^{(2)}h^k + b^{(2)}))^2 \\
&= \frac{1}{2}\sum_{k=1}^{K}(y^k - (w^{(2)}\sigma(w^{(1)}x^k + b^{(1)}) + b^{(2)}))^2
\end{aligned} \quad (6)$$

where K is the total number of samples, $y^k$ is the actual value of the k-th sample $x^k$. $\epsilon_k = (y_k - \hat{y}^k)$. The weights and biases are updated through back-propagation by computing a gradient of each of the values as shown below in Equations 7-10:

$$\frac{\partial L}{\partial w_i^{(2)}} = -\delta_k h_i^k, \quad (7)$$

$$\frac{\partial L}{\partial b_i^{(2)}} = -\delta_k, \quad (8)$$

$$\frac{\partial L}{\partial w_i^{(1)}} = -\delta_k w_i^{(2)} \sigma'(w^{(1)}x^k + b^{(1)}) x_i^k, \quad (9)$$

$$\frac{\partial L}{\partial b_i^{(2)}} = -\delta_k w_i^{(2)} \sigma'(w^{(1)}x^k + b^{(1)}), \quad (10)$$

The weights and biases are then updated as follows in Equation 11 and 12:

$$w_i^{(2)} \leftarrow w_i^{(2)} - \eta \frac{\partial L}{\partial w_i^2}, \quad (11)$$

$$b_i^{(2)} \leftarrow b_i^{(2)} - \eta \frac{\partial L}{\partial b_i^{(2)}}.$$

$$w_i^{(1)} \leftarrow w_i^{(1)} - \eta \frac{\partial L}{\partial w_i^1}, \quad (12)$$

$$b_i^{(1)} \leftarrow b_i^{(1)} - \eta \frac{\partial L}{\partial b_i^{(1)}}.$$

The location of the highest temperature in a measurement is estimated with a neural network model that is based on a modified long short term memory (LSTM) network. The focus in this area is on a single measurement. Therefore, the time step is eliminated from the original network configuration. If a prediction shall be made from multiple measurements, the memory can be easily added back to the network configurations. Once the location of the highest temperature measurement, or location of the heat source is obtained, the temperature or heat flux of distributed points is calculated from the measured heat source information.

Figure 6:
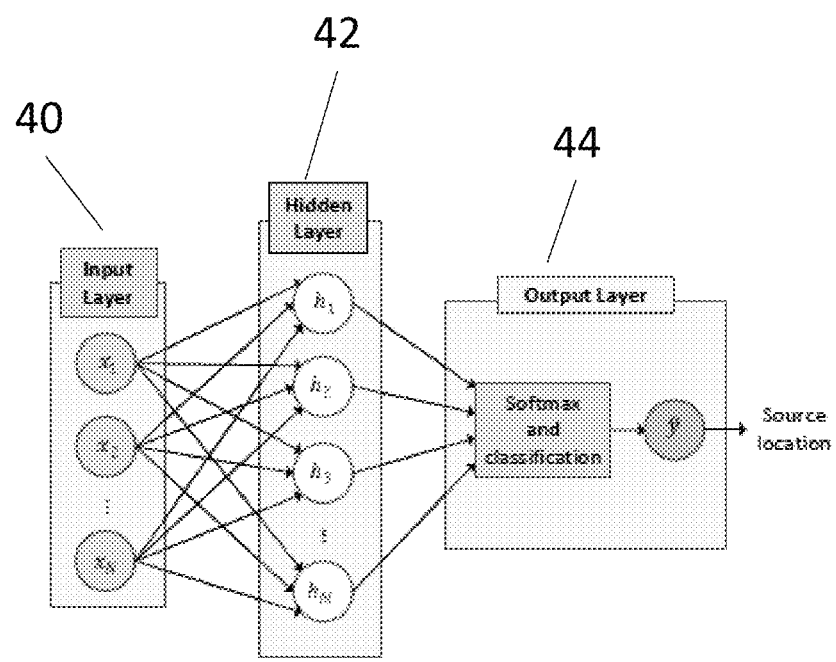
FIG. 6 is a schematic illustration of an LSTM model.

An overview of the location prediction scheme is shown in FIG. 6. Each entry into the input layer 40 is a vector that includes N voltage measurements, i.e. $x=\{x_1; x_2; \ldots ; x_N\}$. The hidden layer 42 includes M hidden units that are modified from an LSTM unit. The output layer 44 includes a Softmax and classification layer that outputs the results to a class of locations.

Figure 7:
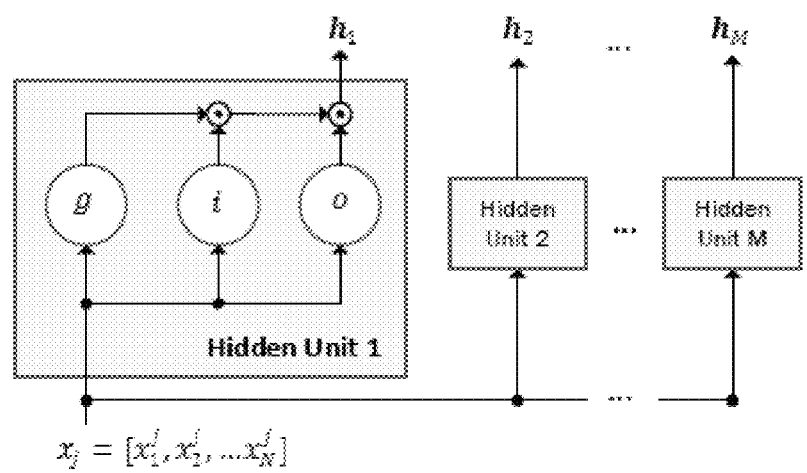
FIG. 7 is a schematic illustration of a hidden unit.

FIG. 7 illustrates a structure of a first hidden unit, with the remaining hidden units having identical structures. As shown, the output of each hidden unit is generated from three functions, g, i, and o. Assuming the output vector is $x_j$, the t-th hidden unit outputs as shown in Equation 13 below:

$$h_t = \tanh(i_t \odot g_t) \odot o_t = \tanh(\sigma(w_i x_j + b_i) \odot \tanh(w_g x_j + v_g)) \odot \sigma(w_o x_j + b_o). \quad (13)$$

where $\odot$ indicates the Hadamard product; $w_g$, $w_i$, $w_o$ are the weights applied to functions g, i, and o respectively; and $b_g$, $b_i$, $b_o$ are the biases applied to the functions g, i, and o respectively. The weights and biases are updated using back propagation that is similar to the ANN model. Note that the time step is not applied in the proposed model, thus back propagation is used, as opposed to back propagation through time.

The conductance matrix C is a MN×MN matrix in which each row contains a maximum of five non-zero elements that are coefficients of relevant node potentials in equation 1. The number of non-zero elements is reduced to four for internal boundary nodes, and three for internal corner nodes because no current flows between internal boundary nodes and exterior boundary nodes. The resistivity of horizontal wires is denoted with a positive Seebeck coefficient as $p_p$, and the resistivity of vertical wires is denoted with a negative Seebeck coefficient as $p_n$. Horizontal distances between adjacent nodes is $d_p$, and vertical distances between adjacent nodes is $d_n$. If the cross-sectional area of all wires are assumed to be identical, the potentials are then independent of the wire diameters which therefore do not appear in matrix C. For a 3×3 Thermomesh sensor, the conductance matrix C takes the form:

$$\begin{bmatrix} R_p + R_n & -R_p & 0 & -R_n & 0 & 0 & 0 & 0 & 0 \\ -R_p & 2R_p + R_n & -R_p & -R_n & 0 & 0 & 0 & 0 & 0 \\ 0 & -R_p & R_p + R_n & 0 & 0 & -R_n & 0 & 0 & 0 \\ -R_n & 0 & 0 & R_p + 2R_n & -R_p & 0 & -R_n & 0 & 0 \\ 0 & -R_n & 0 & -R_p & R_p + 2R_n & -R_p & 0 & -R_n & 0 \\ 0 & 0 & -R_n & 0 & -R_p & R_p + 2R_n & 0 & 0 & -R_n \\ 0 & 0 & 0 & -R_n & 0 & 0 & R_p + R_n & -R_p & 0 \\ 0 & 0 & 0 & 0 & -R_n & 0 & -R_p & 2R_p + R_n & -R_p \\ 0 & 0 & 0 & 0 & 0 & -R_n & 0 & -R_p & R_p + R_n \end{bmatrix} \quad (14)$$

where $$R_p = \frac{d_p}{\rho_p}, \text{ and } R_n = \frac{d_n}{\rho_n}.$$

The corresponding Seebeck coefficient matrix S takes the form:

$$\begin{bmatrix} -S_p - S_n & -S_p & 0 & S_n & 0 & 0 & 0 & 0 & 0 \\ S_p & -2S_p - S_n & S_p & S_n & 0 & 0 & 0 & 0 & 0 \\ 0 & S_p & -S_p - S_n & 0 & 0 & S_n & 0 & 0 & 0 \\ S_n & 0 & 0 & -S_p - 2S_n & S_p & 0 & S_n & 0 & 0 \\ 0 & S_n & 0 & S_p & -2S_p - 2S_n & S_p & 0 & S_n & 0 \\ 0 & 0 & S_n & 0 & S_p & -S_p - 2S_n & 0 & 0 & S_n \\ 0 & 0 & 0 & S_n & 0 & 0 & -S_p - S_n & S_p & 0 \\ 0 & 0 & 0 & 0 & S_n & 0 & S_p & -2S_p - S_n & S_p \\ 0 & 0 & 0 & 0 & 0 & S_n & 0 & S_p & -S_p - S_n \end{bmatrix} \quad (15)$$

where $$S_p = \frac{s_p d_p}{\rho_p}, \text{ and } S_n = \frac{s_n d_n}{\rho_n}.$$

Since C is a singular matrix, the first column of C may be eliminated by setting $U_{1,1}=0$, so a unique solution exists as $$U = C^{-1} ST, \quad (16)$$

The exterior boundary potentials may then be calculated as shown in Equation 17 as:

$$V = \begin{bmatrix} V_1 \\ V_2 \\ \vdots \\ V_N \\ V_{N+1} \\ V_{N+2} \\ \vdots \\ V_{N+M} \\ V_{N+M+1} \\ V_{N+M+2} \\ \vdots \\ V_{2N+M} \\ V_{2N+M+1} \\ V_{2N+M+2} \\ \vdots \\ V_{2N+2M} \end{bmatrix} = \begin{bmatrix} U_1 \\ U_2 \\ \vdots \\ U_N \\ U_{N+1} \\ U_{N+2} \\ \vdots \\ U_{N+M} \\ U_{N+M+1} \\ U_{N+M+2} \\ \vdots \\ U_{2N+M} \\ U_{2N+M+1} \\ U_{2N+M+2} \\ \vdots \\ U_{2N+2M} \end{bmatrix} + s_n \begin{bmatrix} T_{1,1} \\ T_{1,2} \\ \vdots \\ T_{1,N} \\ 0 \\ 0 \\ \vdots \\ 0 \\ T_{M,N} \\ T_{M,N-1} \\ \vdots \\ T_{M,1} \\ 0 \\ 0 \\ \vdots \\ 0 \end{bmatrix} + s_p \begin{bmatrix} 0 \\ 0 \\ \vdots \\ 0 \\ T_{1,N} \\ T_{2,N} \\ \vdots \\ T_{M,N} \\ 0 \\ 0 \\ \vdots \\ 0 \\ T_{M,1} \\ T_{M-1,1} \\ \vdots \\ T_{1,1} \end{bmatrix} = \quad (17)$$

$$U_{2M+2N} + T_{2M+2N}.$$

Finally, all internal and exterior potentials are subtracted by $V_1$ so that $V_1 = 0$ to be consistent with the measurement and rearranged to obtain:

$$v = (I_U C^{-1} S + I_S) T = AT, \text{ where } I_U = U_{2M+2N} U^{-1} \text{ and } I_S = T_{2M+2N} T^{-1} \quad (18).$$

Figure 8A:
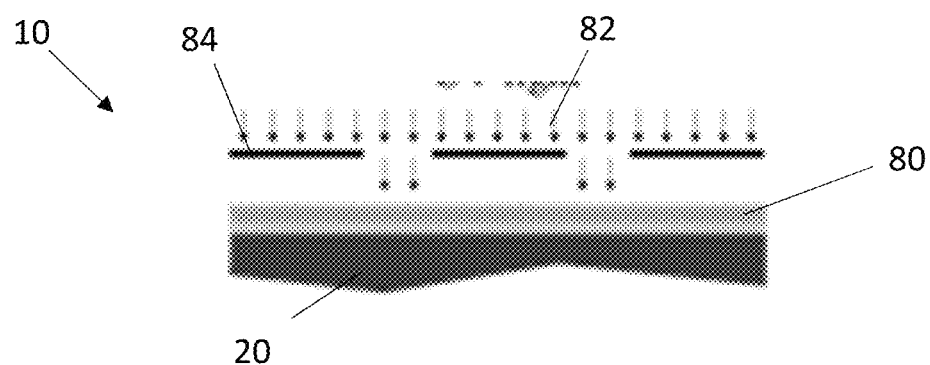
FIGS. 8a-8g are a schematic illustration of a method of manufacturing a heat source sensor.
Figure 8B:
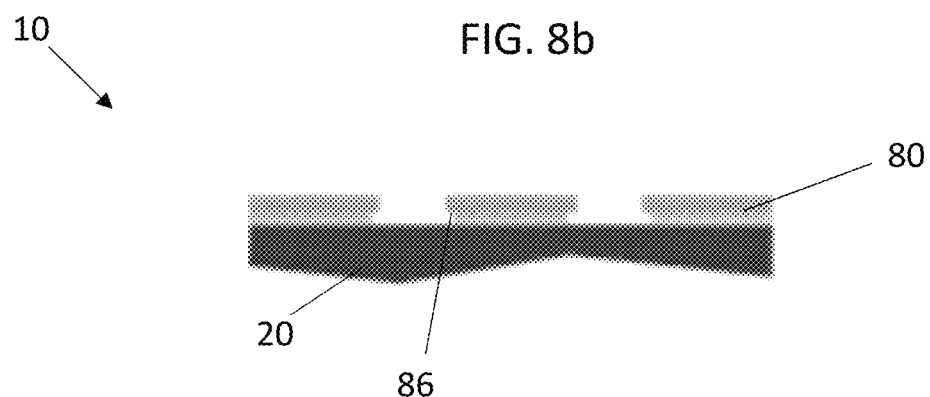
Figure 8C:
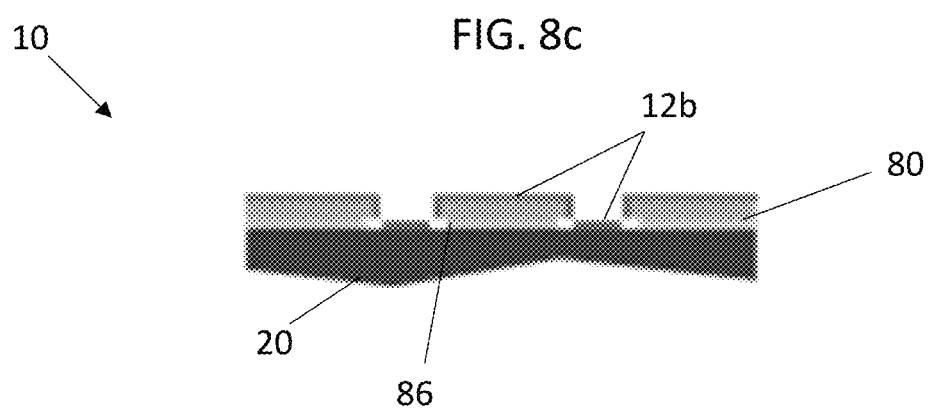
Figure 8D:
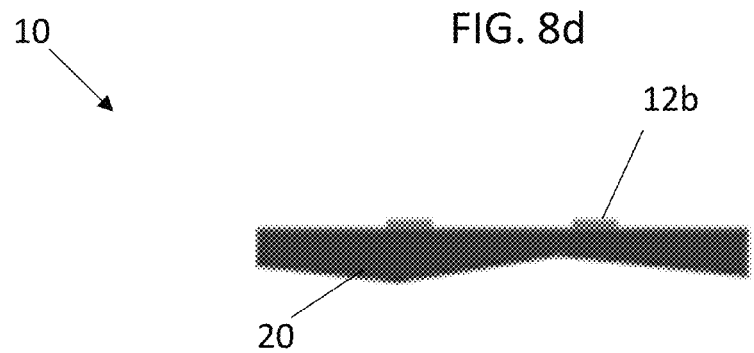
Figure 8E:
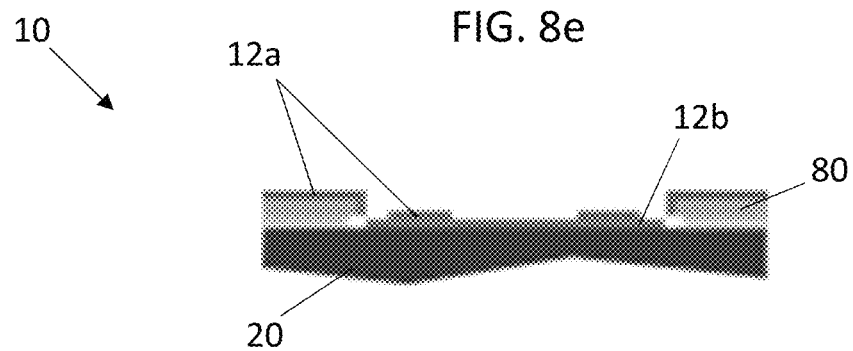
Figure 8F:
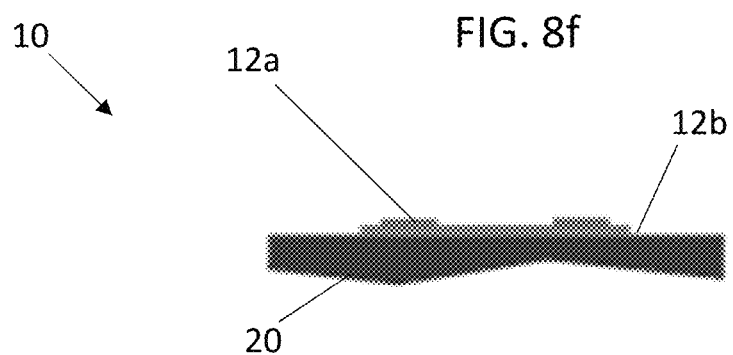
Figure 8G:
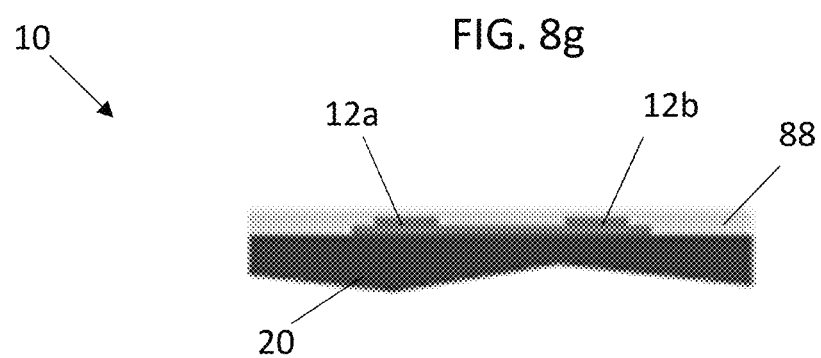

Referring now to FIGS. 8a-8g, illustrated is a schematic view of a method of fabricating a thermomesh sensor 10. In FIG. 8a, the substrate 20 is coated with a resist layer 80 and exposed to UV light 82 through a photomask 84. In FIG. 8b, the resist layer 82 is developed, resulting in an undercut 86. A wire material 12b, for example, Alumel, is applied via, for example, sputtering. The remaining resist layer 82 is then removed via, for example, acetone or other material, leaving the wire 12b material at the substrate 20 as shown in FIG. 8d. The steps in 8a through 8c are repeated for the first wire 12a material, for example, Chromel, with the result illustrated in FIG. 8e. In some embodiments, the deposition of the second wire 12b material is thicker than the deposition of the first wire 12a material to ensure continuity at the nodes 14. In FIG. 8f, the remaining resist layer 82 is removed, leaving the wire 12a material. In some embodiment, as shown in FIG. 8g, an insulation layer 88 is applied over the wire 12a material and the wire 12b material. The insulation layer 88 may be formed from, for example, SiO$_2$.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A heat source sensor, comprising:
   a plurality of first wires extending in a first direction;
   a plurality of second wires extending in a second direction different from the first direction and crossing the plurality of first wires, the plurality of first wires and the plurality of second wires arranged in a wire mesh configuration;
   a plurality of nodes, each node defined by a direct connection of a first wire of the plurality of first wires to a second wire of the plurality of second wires;
   wherein each node of the plurality of nodes defines a measurement point of the heat source sensor, with a difference in thermoelectric electromotive forces between two nodes of the plurality of nodes is utilized to calculate a temperature difference between the two nodes, the temperature difference is utilized to identify a location of a heat source; and
   wherein the first wire is welded to the second wire at each node.

2. The heat source sensor of claim 1, wherein the plurality of first wires is perpendicular or at an angle to the plurality of second wires.

3. The heat source sensor of claim 1, wherein the plurality of first wires are formed from a first material and the plurality of second wires are formed from a second material different from the first material.

4. The heat source sensor of claim 1, wherein the plurality of first wires are Chromel®, and the plurality of second wires are Alumel®.

5. The heat source sensor of claim 1, wherein the plurality of first wires and the plurality of second wires are arranged in a woven configuration.

\* \* \* \* \*